United States Patent
Tanaka et al.

(10) Patent No.: US 8,035,386 B2
(45) Date of Patent: Oct. 11, 2011

(54) NMR PROBE WITH MAGNETIC FIELD IRRADIATING COIL AND NMR SIGNAL RECEIVING COIL

(75) Inventors: Hideki Tanaka, Hitachinaka (JP); Kenji Kawasaki, Hitachi (JP); Hiroyuki Yamamoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 275 days.

(21) Appl. No.: 12/370,663

(22) Filed: Feb. 13, 2009

(65) Prior Publication Data
US 2009/0224758 A1 Sep. 10, 2009

(30) Foreign Application Priority Data
Mar. 7, 2008 (JP) .................................. 2008-057824

(51) Int. Cl.
*G01V 3/00* (2006.01)
(52) U.S. Cl. ........................................ 324/318; 324/322
(58) Field of Classification Search .......... 324/300–322; 600/410–435; 333/219–235
See application file for complete search history.

(56) References Cited

U.S. PATENT DOCUMENTS

| | | | | | |
|---|---|---|---|---|---|
| 4,857,849 | A | * | 8/1989 | Sakamoto | 324/318 |
| 5,208,534 | A | * | 5/1993 | Okamoto et al. | 324/309 |
| 5,635,840 | A |   | 6/1997 | Horigane et al. | |
| 7,511,498 | B2 |  | 3/2009 | Fujimoto et al. | |
| 7,609,064 | B2 |  | 10/2009 | Fukuda | |
| 7,830,146 | B2 | * | 11/2010 | Tanaka et al. | 324/318 |

FOREIGN PATENT DOCUMENTS

| | | |
|---|---|---|
| JP | U 56-52253 | 5/1981 |
| JP | 3-267044 | 11/1991 |
| JP | 08-240651 | 9/1996 |
| JP | 09-019414 | 1/1997 |
| JP | 2007-185421 | 7/2007 |
| JP | 2007-260079 | 10/2007 |
| JP | 2007-322361 | 12/2007 |

* cited by examiner

*Primary Examiner* — Dixomara Vargas
(74) *Attorney, Agent, or Firm* — Antonelli, Terry, Stout & Kraus, LLP.

(57) ABSTRACT

A probe for NMR includes a coil for irradiating an RF magnetic field and a coil for receiving an NMR signal, wherein the coil for irradiating the RF magnetic field includes one wire or one sheet of foil, and the coil for receiving the NMR signal is formed of part of the coil for irradiating the RF magnetic field. A lead wire pair is drawn out from a portion on the way of a winding of the coil that comprises one wire or one sheet of foil, and a coil portion between the lead wire pair is assumed to be a second coil.

9 Claims, 5 Drawing Sheets

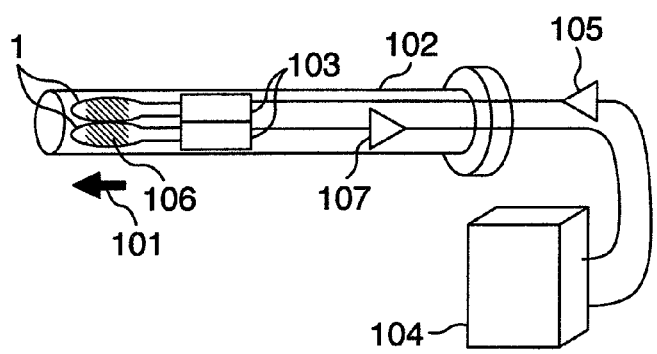
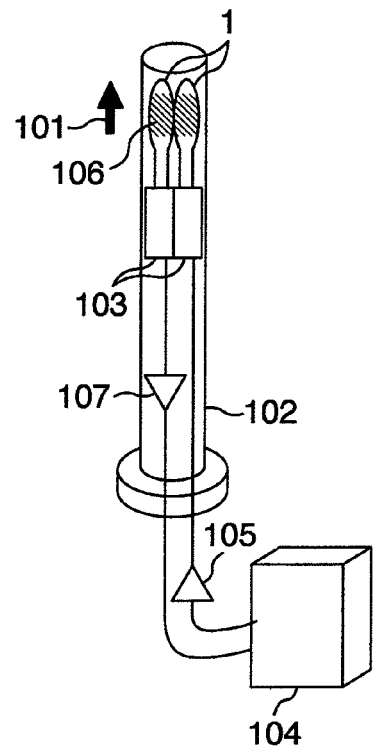
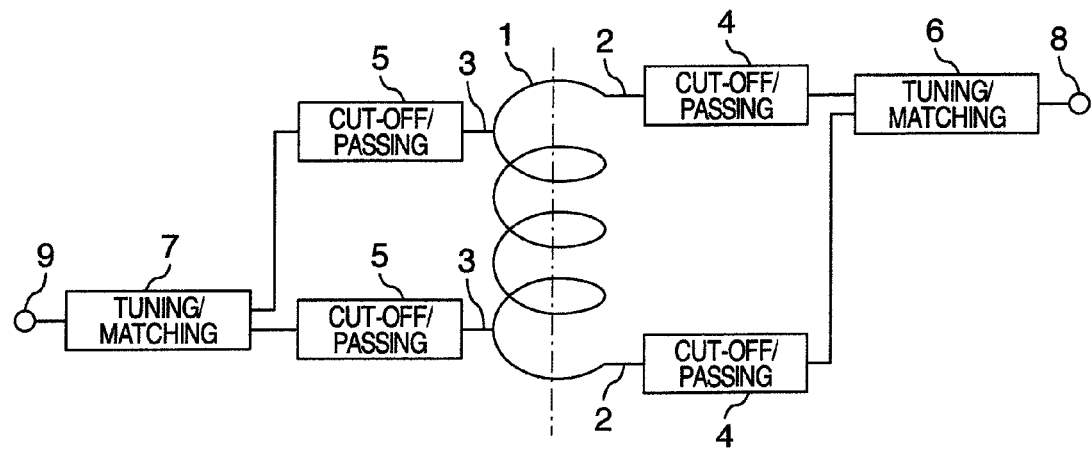

NMR PROBE WITH MAGNETIC FIELD IRRADIATING COIL AND NMR SIGNAL RECEIVING COIL

BACKGROUND OF THE INVENTION

The present invention relates to a probe for nuclear magnetic resonance.

In the NMR or an MRI, when it is desired that an area which is irradiated with an RF magnetic field and an area where an NMR or MRI signal is received be controlled to a desired position, a plurality of coils, which are switchable, have commonly been used. For example, JP-A-2007-185421 discloses a construction in which, as a receiving system, a plurality of coil groups comprising a plurality of RF magnetic field coils are disposed at positions that prevent spatial interference with at least one of RF magnetic field coils of adjacent coil groups, and the RF magnetic field coils that constitute each coil group are sequentially switched before being used.

SUMMARY OF THE INVENTION

A plurality of coils have conventionally been employed in order to control the area for receiving the NMR signal to part of the area which is irradiated with the RF magnetic field, and to enhance the homogeneity of the intensity of the irradiated RF magnetic field. However, the coils for irradiation and reception that are disposed near a sample become a factor for reducing the homogeneity of static magnetic field in the sample region. Therefore, it is desirable that the number of the coils for irradiation and reception be small.

It is an object of the present invention to provide the probe for NMR in which the number of coils can be reduced by causing a coil that comprises one wire or one sheet of foil to take a role that is taken by a plurality of coils.

The probe for NMR according to the present invention has a coil for irradiating an RF magnetic field and a coil for receiving an NMR signal. The coil for irradiating the RF magnetic field comprises one wire or one sheet of foil, and the coil for receiving the NMR signal is formed of part of the coil for irradiating the RF magnetic field.

In the present invention, in order to cause the coil comprising one wire or one sheet of foil to take the role taken by a plurality of coils, a lead wire pair is extended from the middle of a winding of the coil, and coil portions between the lead wire pair are assumed to be a second coil. In the same manner, a third and a fourth coils can also be considered. Then, the second coil is assumed to be a coil for receiving the NMR signal. The third and fourth coils may be used only for irradiation, or only for reception. Alternatively, they may be used both for irradiation and reception.

However, so as to maintain symmetry, it is desirable that the lead wire pair be provided at an equal distance, as much as possible, from the center of the winding.

In a preferred aspect of the present invention, a first lead wire pair is drawn out from both ends of the coil comprising one wire or one sheet of foil and is used for irradiating the RF magnetic field, while the second lead wire pair is drawn out from a portion on the way of the winding of the coil and is used for receiving signals. The part from which the first lead wire pair is drawn out is located farther from the center of the wiring than that from which the second lead wire pair is drawn out.

Two selection circuits are connected to each of the two lead wires that form the first lead wire pair, and a tuning/matching circuit is connected to a subsequent stage of each of the selection circuits. In the same manner, two selection circuits are connected to each of the two lead wires that form the second lead wire pair, with a tuning/matching circuit being connected to a subsequent stage of each of the selection circuits. The connection order of the selection circuits and tuning/matching circuit may be reversed. In other words, first, the tuning/matching circuit may be connected to each of the two lead wires, and the selection circuit may be connected to the subsequent stage of the tuning/matching circuit.

The selection circuit can be switched between a cut-off circuit and a passing circuit for an RF current in accordance with the time when the RF magnetic field is irradiated and the time when the NMR signal is received.

According to the present invention, even one coil is capable of controlling the area for receiving the NMR signal to part of the area where the RF magnetic field is irradiated. This enhances the homogeneity of the intensity of the magnetic field irradiated in the reception area, increases the signal intensity, and improves precision in echoing, selective irradiation, and the like. In addition, since the number of coils disposed near the sample is one, it is possible to prevent a coil-caused decrease in the homogeneity of the static magnetic field in the sample region. Furthermore, one coil can be fabricated more easily.

Other objects, features and advantages of the invention will become apparent from the following description of the embodiments of the invention taken in conjunction with the accompanying drawings.

BRIEF DESCRIPTION OF THE DRAWINGS

FIGS. 6A and 6B are schematic diagrams showing a basic construction of an NMR signal acquisition apparatus;

FIG. 7 is a schematic diagram showing another example in which part of the coil for irradiating the RF magnetic field serves as the coil for receiving the NMR signal;

DESCRIPTION OF THE EMBODIMENTS

For simplicity of description, a certain irradiation frequency is described as a first frequency, and a certain reception frequency is described as a second frequency hereinafter. The first frequency and the second frequency may be the same frequency, or may be different frequencies. It should be noted that a frequency with a margin of error of 1 percent or less is included in the same frequency.

First, both of the selection circuit pair connected to the first lead wire pair are set to passing circuits, both of the selection circuit pair connected to the second lead wire pair are set to cut-off circuits for the first frequency, and the inductance that is constituted of the coil and first lead wire pair is tuned and matched at the first frequency.

Second, both of the selection circuit pair connected to the second lead wire pair are set to passing circuits, both of the selection circuit pair connected to the first lead wire pair are set to cut-off circuits for the second frequency, and the inductance that is constituted of the coil and second lead wire pair is tuned and matched at the second frequency.

If resonance characteristics vary because the tuning/matching circuits have a mutual influence on each other, fine tuning can be made by performing the above adjustment method repeatedly.

When the irradiation of a first frequency magnetic field and the reception of a second frequency magnetic field are actually performed, passive and active switching is performed in such a way that, during irradiation, both of the selection circuits connected to the first lead wire pair are set to the passing circuits, and both of the selection circuit pair connected to the second lead wire pair are set to the cut-off circuits, and, during reception, a reverse combination is made.

As just described in the foregoing, one coil can be properly used as if the shape of the coil is different by changing an RF current path between when the RF magnetic field is irradiated and when an NMR signal is received.

The present invention is capable of enhancing the overall measurement sensitivity in liquid NMR and solid NMR.

Embodiments of the present invention will be described hereinafter. However, the present invention is not limited thereto.

Embodiment 1

Figure 1:
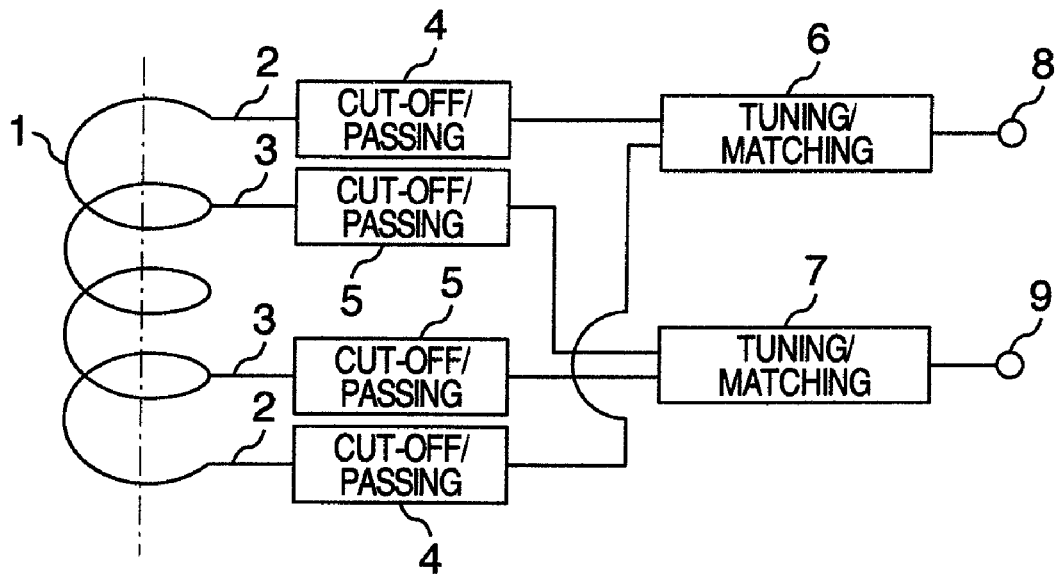
FIG. 1 is a schematic diagram showing an example in which part of a coil for irradiating an RF magnetic field serves as a coil for receiving an NMR signal.

FIG. 1 shows an RF magnetic field coil with four turns, a first lead wire pair 2, and a second lead wire pair 3. The first lead wire pair 2 is drawn out from both ends the RF magnetic field coil. The second lead wire pair 3 is drawn out from positions nearer, by one turn each, to the center than those from which the first lead wire pair is drawn out.

Selection circuits for a first system 4, which are switchable between cut-off circuits and passing circuits, are connected to the lead wires that form the first lead wire pair 2. In the same manner, selection circuits for a second system 5, which are switchable between the cut-off circuits and passing circuits, are connected to the lead wires that form the second lead wire pair 3. Furthermore, a tuning/matching circuit for the first system 6 is connected to each of the passing circuit sides of the selection circuits for the first system 4, and a tuning/matching circuit for the second system 7 is connected to each of the passing circuit sides of the selection circuits for the second system 5.

A power amplifier or the like as an irradiation system, a preamplifier or the like as a reception system, and a switch for switching between the irradiation system and reception system are connected to a signal line for the first system 8 which is connected to the tuning/matching circuit for the first system 6, and a signal line for the second system 9 which is connected to the tuning/matching circuit for the second system 7. However, since this construction is the same as that of the conventional NMR probe, diagrammatical representation thereof is omitted here.

Figure 2:
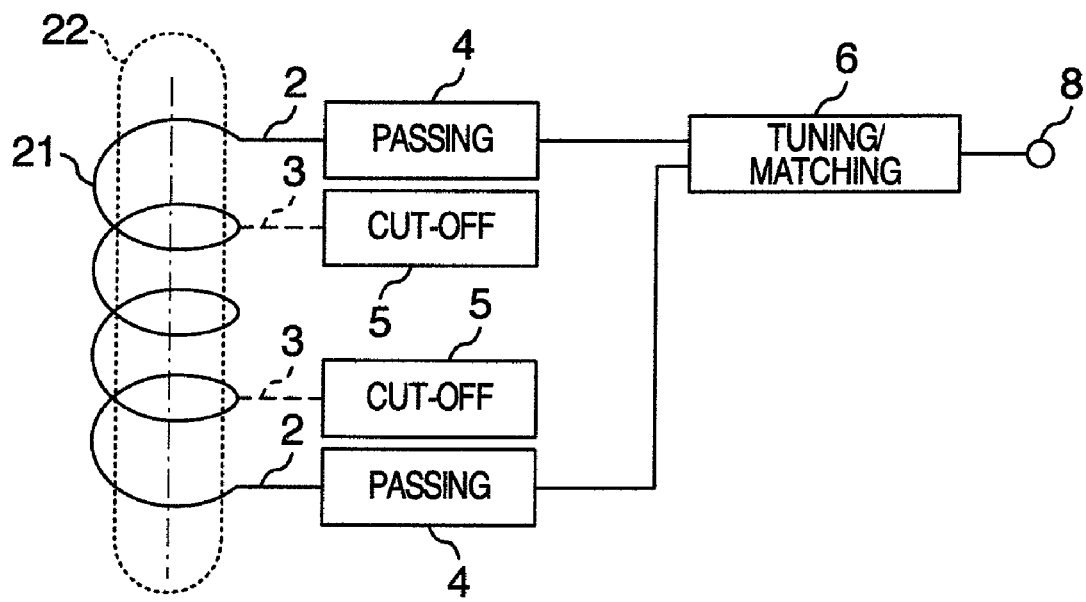
FIG. 2 is a schematic diagram showing a construction during irradiation.
Figure 3:
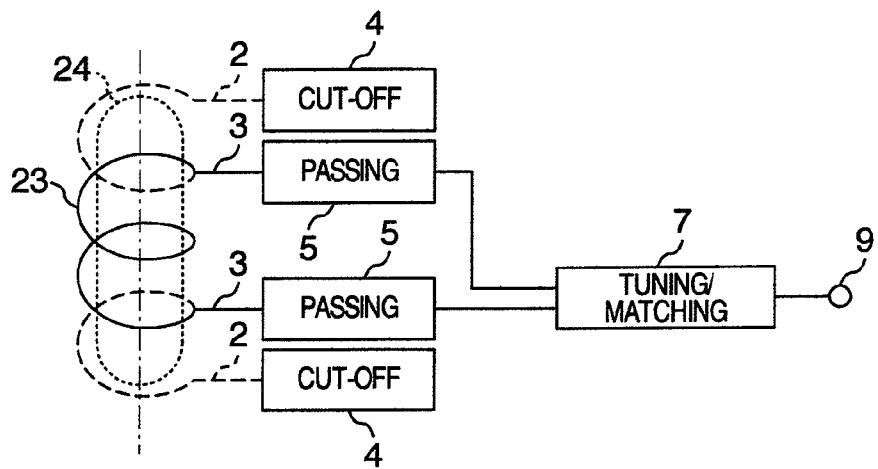
FIG. 3 is a schematic diagram showing a construction during the reception of an NMR signal.

FIG. 2 shows a schematic diagram of a construction that uses the first system to irradiate the RF magnetic field, and FIG. 3 shows a schematic diagram of a construction that uses the second system to receive the NMR signal.

During irradiation, the selection circuits for the first system 4 are set to the passing circuits, and the selection circuits for the second system 5 are set to the cut-off circuits. Therefore, the RF magnetic field coil 1 is regarded to be a four-turn coil like an assumed coil 21 during the first system use. As a result, an area 22 where the magnetic field is irradiated includes an area encircled by the four-turn coil and an area outside thereof.

However, when a solenoid coil is employed, as in the present embodiment, it is possible to cause the intensity of the RF magnetic field irradiated in the area encircled by the coil to be relatively homogeneous. In addition, during transmission, it is possible to prevent the loss of the energy of the RF magnetic field irradiated on an element or an element group located at a subsequent stage of the selection circuits for the second system 5 when viewed from the coil. As a result, the Q factor of the irradiation circuit is improved, thus making it possible to efficiently pass the irradiation energy to the coil.

In contrast, during reception, the selection circuits for the first system 4 are set to the cut-off circuits, while the selection circuits for the second system 5 are set to the passing circuits. Accordingly, the RF magnetic field coil 1 is regarded to be a coil with 2 turns like an assumed coil 23 during the second system use. As a result, an area 24 for receiving the NMR signal includes a region encircled by the two-turn coil and a region outside thereof, as shown by FIG. 3, and is included in the area 22 irradiated with the magnetic field, thus becoming an area irradiated with a magnetic field having a highly homogeneous intensity.

In addition, during reception, the loss of the energy of the NMR signal on an element or an element group located at a subsequent stage, when viewed from the coil, of the selection circuits for the first system 4 is prevented, the Q factor of the reception circuit is improved, and the NMR signal can be efficiently conveyed to a receiving system.

As to the coil shape capable of enhancing homogeneity of the intensity of the irradiated magnetic field, there is a method of adjusting a winding pitch. The homogeneity of the intensity of the magnetic field irradiated in the entire area 24, for example, which corresponds to an area encircled by the three-turn coil, for receiving the NMR signal can be enhanced by applying the present invention after the homogeneity of the intensity of the irradiated magnetic field is enhanced in the area, for example, which corresponds to an area encircled by the four-turn coil by adjusting the winding pitch or the like.

Figure 4:
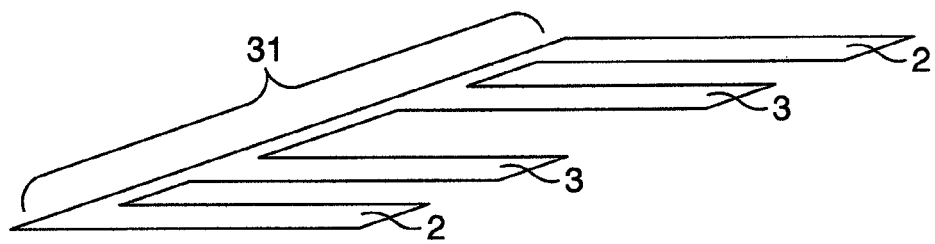
FIG. 4 is an expanded diagram of an RF magnetic field coil comprising one sheet of foil.

When a coil having the shape described in the present embodiment is fabricated from one wire, the coil does not need to be connected to a lead wire pair. In addition, the coil and the one lead wire pair can also be fabricated in one piece. When the coil is fabricated from one sheet of foil, a pattern is created, a coil portion 31 is wound, and the boundary between a first lead wire pair 2 and a second lead wire pair 3 is bent as shown in FIG. 4, thus being formed into the shape of the RF magnetic field coil.

Figure 5:
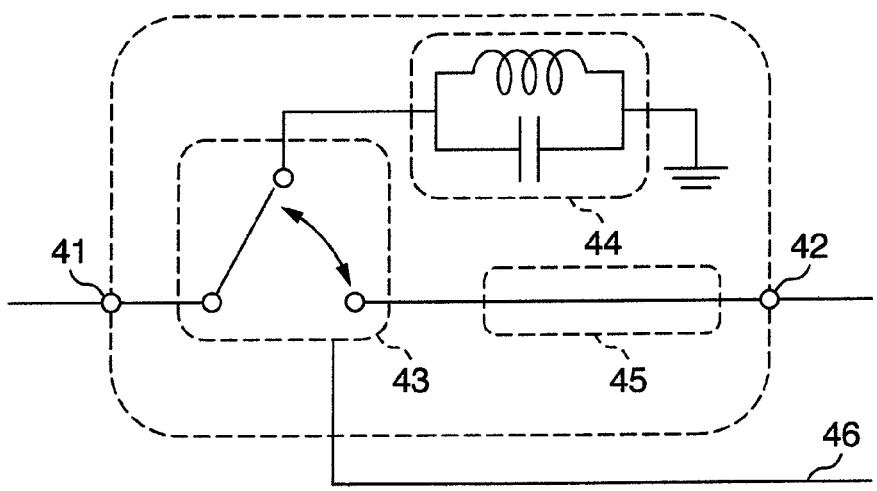
FIG. 5 is a schematic diagram showing an example of a selection circuit.

FIG. 5 shows a schematic diagram of a selection circuit. The main components include a switch 43, a cut-off circuit 44, and a passing circuit 45, totaling 3 components. A lead wire which is drawn out from the coil is connected to a coil side terminal 41, while a tuning/matching circuit is connected to a passing circuit side terminal 42.

There are a passive switch and an active switch in the switch 43. The type of the passive switch includes a switch that utilizes, for example, a diode. This switch is required to convey a signal or the like for controlling a drive voltage and switch timing via a switching wire 46. The type of the active switch includes a switch that utilizes, for example, a superconducting characteristic. The switch is capable of performing switching operations by switching between a normal conductor and a super conductor through the use of current, a magnetic field, and a temperature characteristic.

FIG. 5 shows a parallel resonant circuit as an example of the cut-off circuit 44. The cut-off circuit serves as a circuit for cutting off a desired frequency signal by setting a resonant frequency, which is decided by the values of inductance and capacitance that constitute the parallel resonant circuit, to the frequency desired to be cut off. Examples of the cut-off circuit also include a λ/4 wire.

While the passing circuit 45 is depicted as a normal lead wire in FIG. 5, an element/element group, such as inductance and capacitance, may be included therein, as needed.

FIGS. 6A and 6B show schematic diagrams of a probe in an NMR signal acquisition apparatus. A static magnetic field whose direction is pointed by an arrow 101 is generated by a static magnetic field generation device, such as a superconducting magnet, and a static magnetic field compensation device. The RF magnetic field coil 1 described above is mounted on the probe 102. It is disposed near the center of the static magnetic field. The irradiation system and reception system are adjusted by the tuning/matching circuit 103 disposed within the probe in such a manner that they resonate at a predetermined frequency. An RF signal outputted from a measurement console 104 is amplified at a power amplifier 105, inputted into the probe 102, and irradiated to a sample 106. A received signal is conveyed to the measurement console 104 via a preamplifier 107. While a gradient magnetic field coil group or the like is also sometimes included in the probe, a diagrammatic description thereof is omitted here. The longitudinal direction of the probe may be arranged in the horizontal direction as shown in FIG. 6A or may be arranged in the vertical direction as shown in FIG. 6B depending on the direction 101 of the static magnetic field.

In FIGS. 6A and 6B, an irradiation coil and a reception coil are separately described for the sake of simplicity of illustration. However, the present invention is not limited thereto. In FIGS. 6A and 6B, the selection circuit is also omitted.

When the sample 106 is a liquid, the NMR may be expressed as NMR for liquid samples, and when the sample 106 is a solid matter, the NMR may be expressed as an NMR for solid samples or the like. However, the present invention is applicable to any case, irrespective of the state of the samples.

Embodiment 2

FIG. 7 shows another embodiment. In the embodiment 1, the assumed coil 21 during the first system use is equivalent to the four-turn coil, and the assumed coil 23 during the second system use is equivalent to the two-turn coil. However, in the present embodiment, a second lead wire pair 3 is drawn out from the RF magnetic field coil 1 such that the assumed coil during the second system use is equivalent to a three-turn coil.

The number of turns for the assumed coil can be set to a desired number by changing the positions from which the lead wire pair is drawn out as above described.

In FIG. 7, the first system and second system are formed to sandwich the RF magnetic field coil 1. However, if it is difficult to make disposition in a manner shown in FIG. 7 during mounting of the probe, the systems may be disposed on one side of the RF magnetic field coil 1 by causing the lead wire to make a detour or other methods.

Embodiment 3

Figure 8:
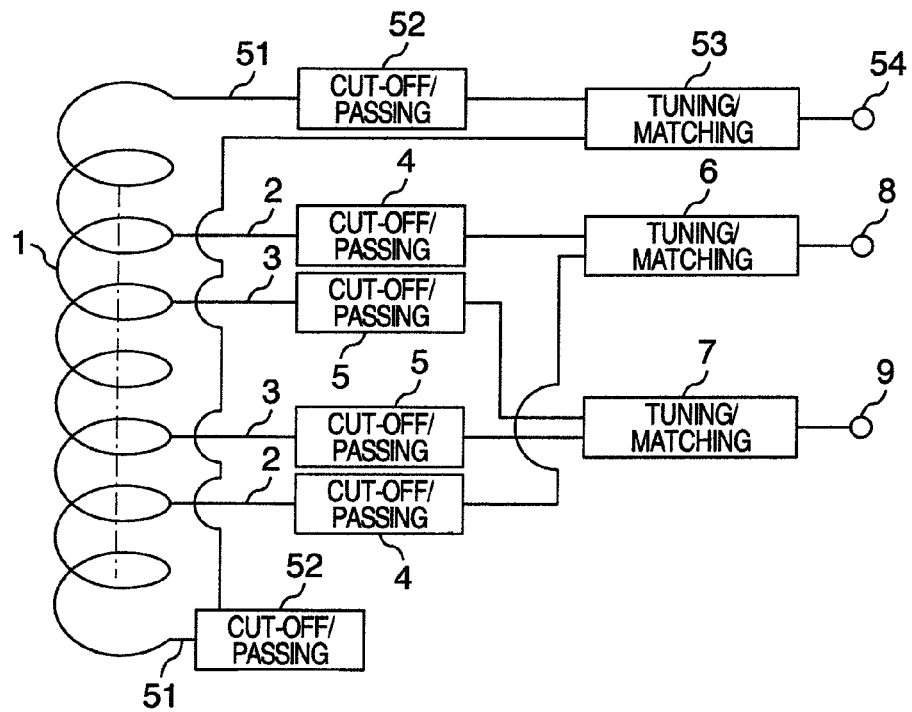
FIG. 8 is a schematic diagram showing still another example in which part of the coil for irradiating the RF magnetic field serves as the coil for receiving the NMR signal.

In the embodiment 1, the first system is set to the irradiation system, while the second system is set to the reception system. In an embodiment 3 shown in FIG. 8, a third system is added. The third system may use the same frequency as that used by the first and second systems or may use a different frequency.

The components of the third system include a third lead wire pair 51, selection circuits for the third system 52, a tuning/matching circuit for the third system 53, and a signal wire for the third system 54. The third system may be used for any of the following purposes: only irradiation, only reception, and both irradiation and reception.

The number of systems can be increased in this manner to the third system or to a fourth system. The kind of nuclei to be measured can be increased by assigning different frequencies to the increased systems.

Embodiment 4

Figure 9:
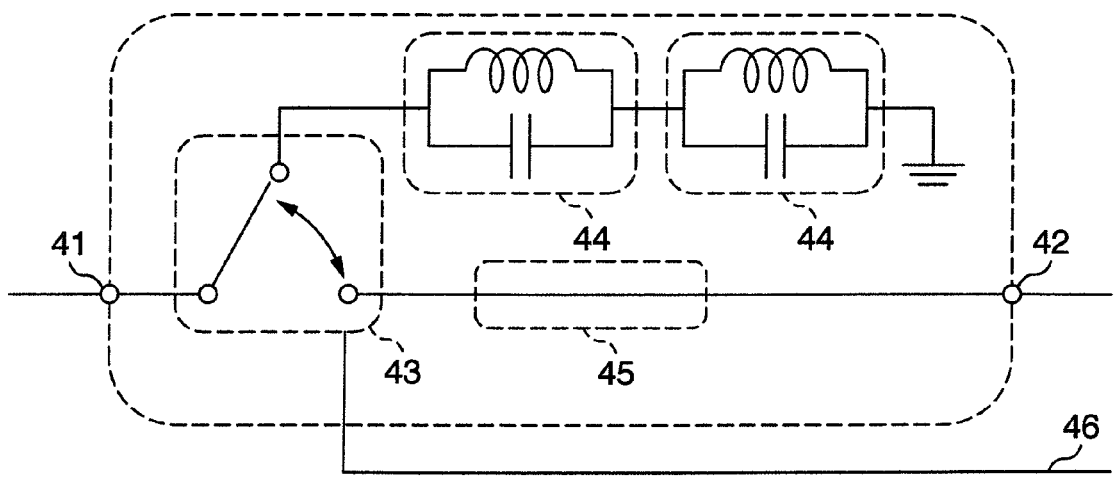
FIG. 9 is a schematic diagram showing another example of the selection circuit.

When a plurality of frequencies are used as described in the embodiment 3, the cut-off circuit has also to cope with the plurality of frequencies. When there are two kinds of frequencies desired to be cut off, parallel resonant circuits are connected in two stages, as shown in FIG. 9, and inductance and capacitance may be set in such a way that each resonant frequency becomes the frequency desired to be cut off.

Embodiment 5

Figure 10:
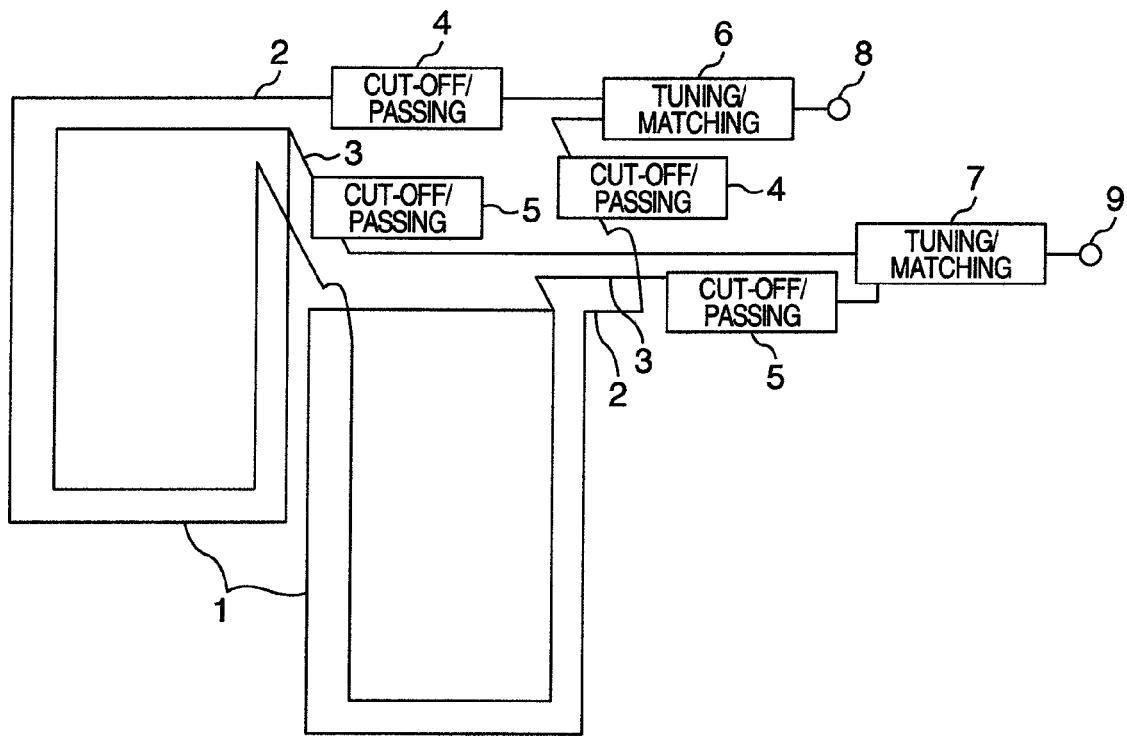
FIG. 10 is a schematic diagram showing an example in which a saddle coil is used for the RF magnetic field coil 1.

Embodiments 1 to 4 have been described by taking a case in which a solenoid coil is used for the RF magnetic field coil 1 as an example. In the present embodiment, a saddle coil is used for the RF magnetic field coil 1. A construction shown in FIG. 10 would enable the assumed coil during the first system use to be used as the saddle coil with four turns, and the assumed coil during the second system use to be used as the saddle coil with two turns.

Embodiment 6

Figure 11:
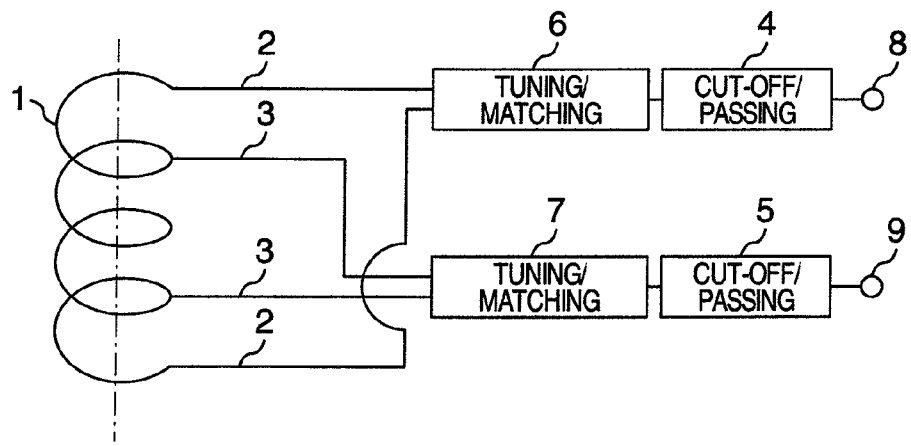
FIG. 11 is a schematic diagram showing an example in which the selection circuits are disposed at a subsequent stage of tuning/matching circuits when viewed from the RF magnetic field coil.

In the embodiments 1 to 5 described above, the selection circuits are disposed between the FR magnetic coil 1 and the tuning/matching circuits. In the present embodiment, as is shown in FIG. 11, the selection circuits are disposed at a subsequent stage of the tuning/matching circuits when viewed from the RF magnetic coil 1.

This configuration eases the restriction on the region of space where the selection circuits are disposed, and reduces the intensity of the static magnetic field to be applied to the selection circuits. As a result, the specification of the elements used for the selection circuits is eased, and the production of the selection circuits is facilitated. In addition, this configuration reduces the number of the selection circuits required. The present embodiment is also applicable to the embodiments 1 to 5.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A probe for NMR comprising a coil for irradiating an RF magnetic field and a coil for receiving an NMR signal, wherein:
   said coil for irradiating the RF magnetic field comprises one wire or one sheet of foil; and
   said coil for receiving the NMR signal is formed of part of said coil for irradiating the RF magnetic field;
   a first lead wire pair is drawn out from both ends of the coil comprising one wire or one sheet of foil;
   a second lead wire pair is drawn out from a portion on the way of said coil that is nearer to the center than said first lead wire pair;
   a coil's portion for irradiating the RF magnetic field is defined as a portion between said first lead wire pair; and
   a coil's portion for receiving the NMR signal is defined as a portion between said second lead wire pair.

2. The probe for the NMR according to claim 1, wherein:
   two tuning/matching circuits, one is connected to both ends of said coil for irradiating the RF magnetic field and the other is connected to both ends of said coil for receiving the NMR signal via selection circuits; and
   said selection circuits are switchable between cut-off circuits and passing circuits for the RF current in accordance with the time when the RF magnetic field is irradiated and when the NMR signal is received.

3. The probe for the NMR according to claim 1, wherein:
   two tuning/matching circuits, one is connected to both ends of said coil for irradiating the RF magnetic field and the other is connected to both ends of said coil for receiving the NMR signal;
   each selection circuit is connected to a subsequent stage of each of said tuning/matching circuits; and
   said each selection circuit is switchable between the cut-off circuit and the passing circuit for the RF current in accordance with the time when the RF magnetic field is irradiated and when the NMR signal is received.

4. The probe for the NMR according to claim 1, wherein:
   said second lead wire pair is provided equidistantly or substantially equidistantly from the center of a winding of said coil.

5. The probe for the NMR according to claim 1, wherein:
   each selection circuit is connected to each of the two lead wires that constitute said first lead wire pair, and a tuning/matching circuit is connected to subsequent stages of the selection circuits;
   each selection circuit is connected to each of the two lead wires that constitute said second lead wire pair, and a tuning/matching circuit is connected to subsequent stages of the selection circuits; and
   said selection circuits are switchable between the cut-off circuits and passing circuits in accordance with the time when the RF magnetic field is irradiated and when the NMR signal is received.

6. The probe for the NMR according to claim 1, wherein:
   another coils are added to the ends of said coil comprising one wire or one sheet of foil;
   a third lead wire pair is drawn out from both ends of the coils added;
   each selection circuit is connected to each of the two lead wires that constitute the third lead wire pair; and
   a tuning/matching circuit is connected to subsequent stages of the selection circuits.

7. The probe for the NMR according to claim 1, wherein:
   an irradiation frequency of said coil for irradiating the RF magnetic field matches or substantially matches a reception frequency of said coil for receiving the NMR signal.

8. The probe for the NMR according to claim 1, wherein:
   an irradiation frequency of said coil for irradiating the RF magnetic field differs from a reception frequency of said coil for receiving the NMR signal.

9. The probe for the NMR according to claim 1, wherein:
   said coil for irradiating the RF magnetic field comprising one wire or one sheet of foil is formed of a solenoid coil or a saddle coil.

* * * * *